United States Patent
Lo et al.

(10) Patent No.: US 9,588,717 B2
(45) Date of Patent: Mar. 7, 2017

(54) FAULT-TOLERANCE THROUGH SILICON VIA INTERFACE AND CONTROLLING METHOD THEREOF

(71) Applicant: INDUSTRIAL TECHNOLOGY RESEARCH INSTITUTE, Hsinchu (TW)

(72) Inventors: Chih-Yen Lo, Hsinchu (TW); Ding-Ming Kwai, Zhubei (TW); Chi-Chun Yang, Taichung (TW); Kuan-Te Wu, New Taipei (TW); Yun-Chao Yu, Taipei (TW); Jin-Fu Li, Pingzhen (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 158 days.

(21) Appl. No.: 14/578,053

(22) Filed: Dec. 19, 2014

(65) Prior Publication Data

US 2016/0132403 A1 May 12, 2016

(30) Foreign Application Priority Data

Nov. 12, 2014 (TW) ............... 103139200 A

(51) Int. Cl.
  *G06F 3/06* (2006.01)
  *G11C 29/00* (2006.01)

(52) U.S. Cl.
  CPC .......... *G06F 3/0688* (2013.01); *G06F 3/0617* (2013.01); *G06F 3/0635* (2013.01);
  (Continued)

(58) Field of Classification Search
  USPC ....................................... 714/4.2
  See application file for complete search history.

(56) References Cited

U.S. PATENT DOCUMENTS 8,310,382 B2 11/2012 Ide et al.
8,339,827 B2 12/2012 Jeddeloh
(Continued)

FOREIGN PATENT DOCUMENTS

CN 103780243 A 5/2014
TW 201209842 A 3/2012
(Continued)

OTHER PUBLICATIONS

Intra-Channel Reconfigurable Interface for TSV and Micro Bump Fault Tolerance in 3-D RAMs, Kuan-Te Wu, Jin-Fu Li, Yun-Chao Yu, Chih-Sheng Hou, and Chi-Chun Yang, Ding-Ming Kwai, Yung-Fa Chou and Chih-Yen Lo, 2014 IEEE 23rd Asian Test Symposium.*

(Continued)

*Primary Examiner* — Kamini Patel
(74) *Attorney, Agent, or Firm* — Muncy, Geissler, Olds & Lowe, P.C.

(57) ABSTRACT

A fault-tolerance through silicon via (TSV) interface is disposed in a three-dimensional random access memory (3-D RAM) with N memory layers and M data access path sets, and each of the memory layers containing K memory arrays, and each of the data access path sets containing a plurality of TSV paths connecting to the memory layers. The fault-tolerance TSV interface includes a path controlling unit and a processing unit. The path controlling unit detects and controls the data access path sets. When a fault occurs in any data access path set connecting to a memory layer, the processing unit provides at least two different fault-tolerance access configurations. In each of the fault-tolerance access configurations, $\mu$ data access path sets are enabled to access all K memory arrays in the corresponding memory layer, where $0<\mu<M$.

16 Claims, 8 Drawing Sheets

(52) U.S. Cl.
CPC .......... *G11C 29/702* (2013.01); *G11C 29/816* (2013.01); *G11C 29/84* (2013.01)

(56) References Cited

U.S. PATENT DOCUMENTS

| | | | |
|---|---|---|---|
| 8,384,417 | B2 | 2/2013 | Laisne et al. |
| 8,554,991 | B2* | 10/2013 | Thayer ............... G11C 7/10 356/219 |
| 8,559,238 | B2 | 10/2013 | Janzen |
| 8,593,170 | B2 | 11/2013 | Van der Plas et al. |
| 8,654,593 | B2 | 2/2014 | Oh et al. |
| 8,773,157 | B2 | 7/2014 | Badaroglu et al. |
| 2001/0043563 | A1* | 11/2001 | Gerstel ............... H04J 14/0297 370/228 |
| 2009/0070721 | A1* | 3/2009 | Solomon ............. G06F 17/5045 716/118 |
| 2010/0005736 | A1 | 1/2010 | Dayton et al. |
| 2010/0121994 | A1* | 5/2010 | Kim ................... G06F 13/1684 710/51 |
| 2010/0295600 | A1* | 11/2010 | Kim ................... H01L 25/0657 327/365 |
| 2011/0292742 | A1 | 12/2011 | Oh et al. |
| 2012/0137040 | A1 | 5/2012 | Kim et al. |
| 2012/0146099 | A1 | 6/2012 | Geer et al. |
| 2012/0154020 | A1 | 6/2012 | Lee et al. |
| 2012/0248438 | A1* | 10/2012 | Lung .................. H01L 25/0657 257/48 |
| 2012/0322203 | A1 | 12/2012 | Or-Bach et al. |
| 2013/0024737 | A1* | 1/2013 | Marinissen .... G01R 31/318508 714/727 |
| 2013/0091312 | A1 | 4/2013 | Ken et al. |
| 2013/0093454 | A1* | 4/2013 | Lai ................. G01R 31/318513 324/762.01 |
| 2013/0254473 | A1 | 9/2013 | Bartley et al. |
| 2013/0272049 | A1 | 10/2013 | Vogt et al. |
| 2014/0062586 | A1 | 3/2014 | Shih et al. |
| 2014/0063887 | A1 | 3/2014 | Vogelsang |
| 2014/0176187 | A1* | 6/2014 | Jayasena ............ H03K 19/1776 326/39 |
| 2014/0181458 | A1* | 6/2014 | Loh ..................... G06F 12/1027 711/206 |
| 2014/0233292 | A1 | 8/2014 | Kang et al. |
| 2014/0266418 | A1* | 9/2014 | Huang .................... H01L 23/50 327/565 |
| 2015/0185274 | A1* | 7/2015 | Hwang .......... G01R 31/318513 324/750.3 |
| 2015/0242308 | A1* | 8/2015 | Kim ........................ G06F 11/27 711/105 |
| 2016/0071783 | A1* | 3/2016 | Barowski .............. H01L 23/481 327/564 |
| 2016/0071819 | A1* | 3/2016 | Fuergut ............... H01L 23/3107 257/774 |

FOREIGN PATENT DOCUMENTS

| | | |
|---|---|---|
| TW | I424530 B | 1/2014 |
| TW | I450316 B | 8/2014 |

OTHER PUBLICATIONS

Uksong Kang, et al., "8 Gb 3-D DDR3 DRAM Using Through-Silicon-Via Technology," *IEEE Journal of Solid-State Circuits*, vol. 45, No. 1, pp. 111-119, Jan. 2010.

Nicolaidis, M. et al., "Through-silicon-via built-in self-repair for aggressive 3D integration," *2012 IEEE 18th International On-Line Testing Symposium (IOLTS)*, pp. 91-96, Jun. 27-29, 2012.

Yu-Jen Huang, et al., "Built-In Self-Repair Scheme for the TSVs in 3-D ICs," *IEEE Transactions on Computer-Aided Design of Integrated Circuits and Systems*, vol. 31, No. 10, pp. 1600-1613, Oct. 2012.

Ang-Chih Hsieh, et al., "TSV Redundancy: Architecture and Design Issues in 3-D IC," *IEEE Transactions on Very Large Scale Integration (VLSI) Systems*, vol. 20, No. 4, pp. 711-722, Apr. 2012.

Loi, I.et al., "Characterization and Implementation of Fault-Tolerant Vertical Links for 3-D Networks-on-Chip," *IEEE Transactions on Computer-Aided Design of Integrated Circuits and Systems*, vol. 30, No. 1, pp. 124-134, Jan. 2011.

Li Jiang, et al., "On Effective Through-Silicon Via Repair for 3-D-Stacked ICs," *IEEE Transactions on Computer-Aided Design of Integrated Circuits and Systems*, vol. 32, No. 4, pp. 559-571, Apr. 2013.

Kuan-Te Wu, et al., "Intra-channel Reconfigurable Interface for TSV and Micro Bump Fault Tolerance in 3-D RAMs," *2014 IEEE 23rd Asian Test Symposium (ATS)*, pp. 143-148, Nov. 16-19, 2014.

* cited by examiner

FAULT-TOLERANCE THROUGH SILICON
VIA INTERFACE AND CONTROLLING
METHOD THEREOF

CROSS REFERENCE TO RELATED
APPLICATION

This application claims the priority benefit of Taiwan application serial no. 103139200, filed on Nov. 12, 2014. The entirety of the above-mentioned patent application is hereby incorporated by reference herein and made a part of this specification.

TECHNICAL FIELD

The present disclosure is related to a fault-tolerance through silicon via interface and the corresponding controlling method.

BACKGROUND

Three-dimensional (3-D) integration is one of important technologies for future integrated circuit design. Semiconductor chips are stacked together and their signals are connected vertically using through silicon vias (TSVs). Comparing with packaging technologies that rely on bond wires, such as system in package (SiP), TSVs provide shorter interconnections between stacked chips, with lower power consumption and higher signal transmission speed. Since TSVs have a much finer pitch than that of bond wires used in SiP, the limitation in available interconnections and the data transmission bottleneck in SiP can be alleviated.

Three-dimensional (3-D) integration technology has been widely used, especially in memory related designs to increase the storage capacity. Three-dimensional random access memory (3-D RAM), which vertically stacks a plurality of memory chips, could apply the TSV interface to access the data of its memory arrays from outside.

With high data bandwidth and large storage capacity targeting at high-performance computing, manufacturing yield becomes a critical issue to make the 3-D RAM practical and mass producible. Comparing with traditional two-dimensional random access memory (2-D RAM) design, the 3-D RAM requires more considerations to sustain a high yield rate. A large number of TSV paths connect the data, address, command, and control signals of the stacked chips from the bottom layer to the top. To guarantee the operations of 3-D RAM, not only each layer of the stacked chips should work properly, but also the TSV paths among layers should be fault-free.

SUMMARY OF THE DISCLOSURE

In one of the exemplary embodiments, the present disclosure is directed to a fault-tolerance through silicon via (TSV) interface. The interface is disposed in a three-dimensional random access memory (3-D RAM) with N memory layers and M data access path sets, and each of the memory layers includes K memory arrays, and each of the data access path sets includes a plurality of TSV paths connecting to the memory layers. The fault-tolerance TSV interface includes a path controlling unit and a processing unit. The path controlling unit detects and controls the data access path sets. When a fault occurs in one of the data access path sets, the processing unit provides at least two different access configurations to tolerate the fault. In each of the access configurations, μ out of M data access path sets, where $0<\mu<M$, are enabled to access one of the corresponding memory layers with all K memory arrays.

In one of the exemplary embodiments, the present disclosure is directed to a fault-tolerance TSV interface controlling method. The method provides a 3-D RAM with N memory layers and M data access path sets, and each of the memory layers includes K memory arrays, and each of the data access path sets includes a plurality of TSV paths connecting to the memory layers. The fault-tolerance TSV interface is disposed on each of the memory layers. The method provides at least two different access configurations for the purpose of fault tolerance. In each of the access configurations, μ out of M data access path sets, where $0<\mu<M$, are enabled to access one of the corresponding memory layers with all K memory arrays.

In one of the exemplary embodiments, the present disclosure is directed to a fault-tolerance TSV interface controlling method. The method provides a 3-D RAM with N memory layers and M data access path sets, and each of the memory layers includes K memory arrays, and each of the data access path sets includes a plurality of TSV paths connecting to the memory layers. The method provides at least two different fault-tolerance access configurations, wherein the access of the memory layers is through a proper arrangement of the access configurations to avoid the fault.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
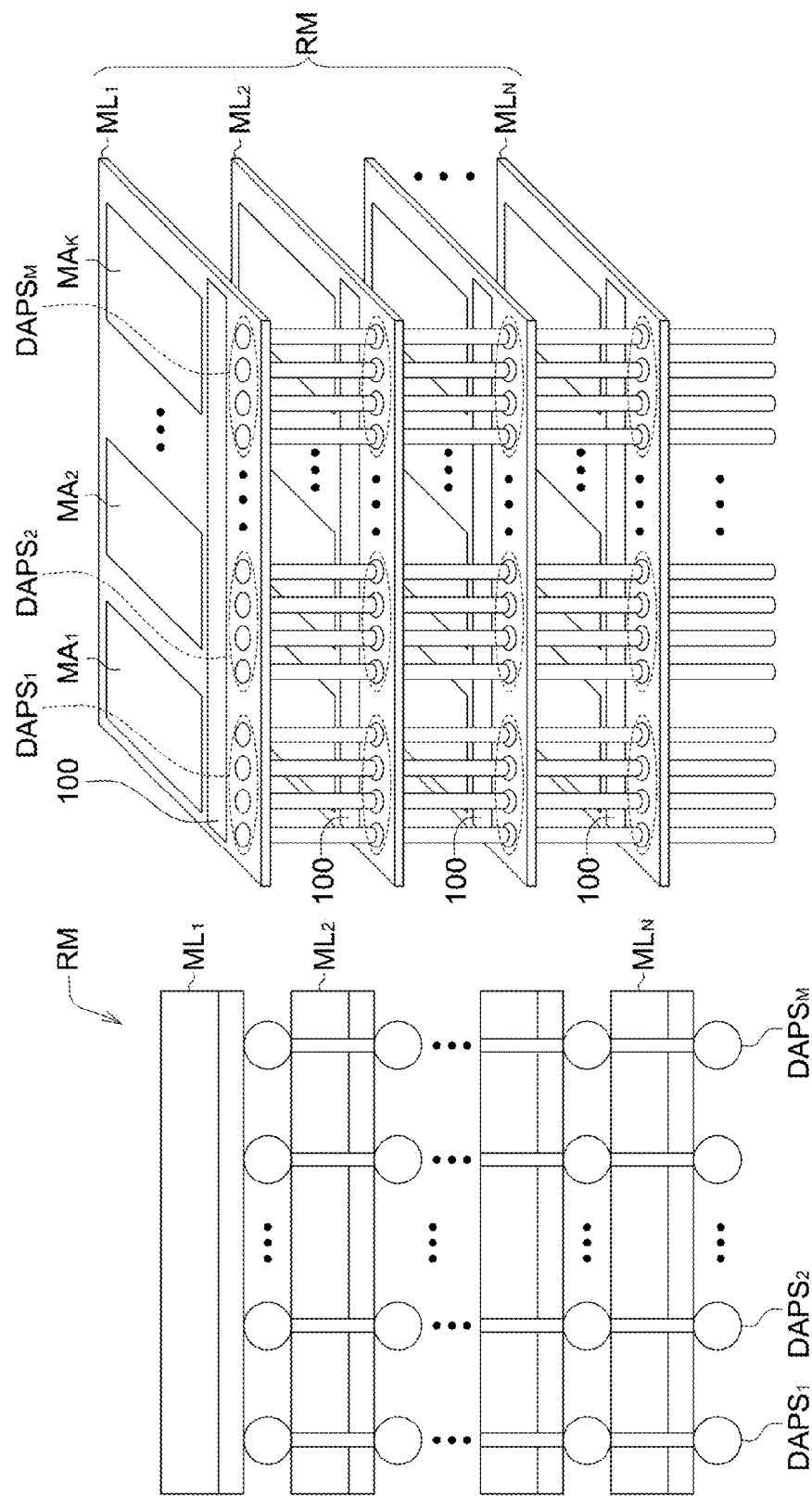
FIG. 1 illustrates an exemplary embodiment of the three-dimensional random access memory and fault-tolerance through silicon via interface.

FIG. 1 illustrates an exemplary embodiment of a 3-D RAM, namely, RM, with a fault-tolerance TSV interface 100. On the left, a cross-sectional view of the 3-D RAM is with M data access path sets which are labeled as $DAPS_1$, $DAPS_2$, ... $DAPS_M$. On the right, the 3-D RAM consists of N memory layers $ML_1$, $ML_2$, ..., $ML_N$ and M data access path sets $DAPS_1$, $DAPS_2$, ..., $DAPS_M$. Each memory layer contains K memory arrays $MA_1$, $MA_2$, ..., $MA_K$. Each data access path set includes a plurality of TSV paths. The plurality of TSV paths connect to the memory layers $ML_1$, $ML_2$, ..., $ML_N$. When normal access configurations are adopted to access the 3-D RAM, all M data access path sets $DAPS_1$, $DAPS_2$, ..., $DAPS_M$ are enabled to access the K memory arrays $MA_1$, $MA_2$, ..., $MA_K$ in a single memory layer. For the other memory layers not being accessed, the data access path sets connecting to them are disabled. Because the TSVs paths connect to all memory layers, every memory array in each memory layer could be accessed. However, all TSV paths must be fault-free. As the number of the stacked chips or the access data width increases, maintaining all TSV paths fault-free becomes a severe issue. The yield of the 3-D RAM will drop drastically if we have no counterplot.

Figure 2:
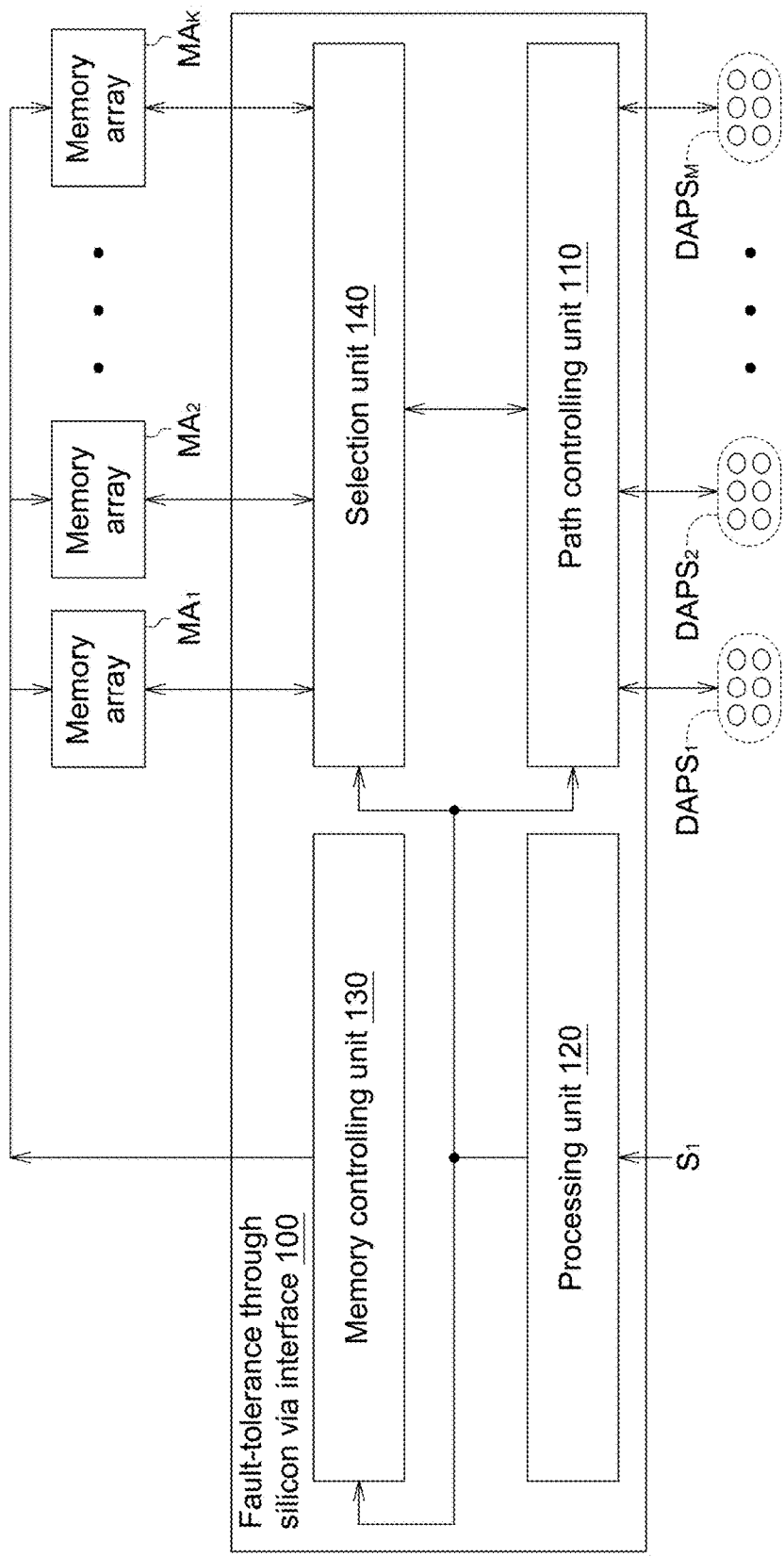
FIG. 2 illustrates an exemplary embodiment of the fault-tolerance through silicon via interface.

FIG. 2 illustrates an exemplary embodiment of a fault-tolerance TSV interface 100. The interface 100 includes a path controlling unit 110, a processing unit 120, a memory controlling unit 130, and a selection unit 140. The path controlling unit 110 detects and controls the data access path sets $DAPS_1$, $DAPS_2$, ..., $DAPS_M$ connecting to the corresponding memory layer according to the selected configuration. The processing unit 120 plans and executes the related setting of the configurations in the fault-tolerance TSV interface 100. The memory controlling unit 130 controls the activation of the memory arrays $MA_1$, $MA_2$, ..., $MA_K$ according to the selected configuration in the corresponding memory layer. The selection unit 140 selects the data access of each memory array according to the selected configuration in the corresponding memory layer. In an exemplary embodiment of a fault-tolerance TSV interface 100, the function of the selection unit 140 could be incorporated into the memory controlling unit 130. Furthermore, the function of the selection unit 140 could be chosen or modified according to the practical application. The path controlling unit 110, the processing unit 120, the memory controlling unit 130, and the selection unit 140 could be a single chip, or an interposer, or a partial circuit in a chip.

When the path controlling unit 110 located in a memory layer detects is a fault among the data access path sets $DAPS_1$, $DAPS_2$, ..., $DAPS_M$, adopting normal access configurations fails to maintain a full robust data width to the memory array $MA_1$, $MA_2$, ..., $MA_K$ in the memory layer of the 3-D RAM. In our exemplary embodiment, the processing unit 120 located in each memory layer provides a proper arrangement of fault-tolerance access configurations to access memory arrays $MA_1$, $MA_2$, ..., $MA_K$ in memory layers $ML_1$, $ML_2$, ..., $ML_N$ when a fault exists among the data access path sets $DAPS_1$, $DAPS_2$, ..., $DAPS_M$.

Figure 3A:
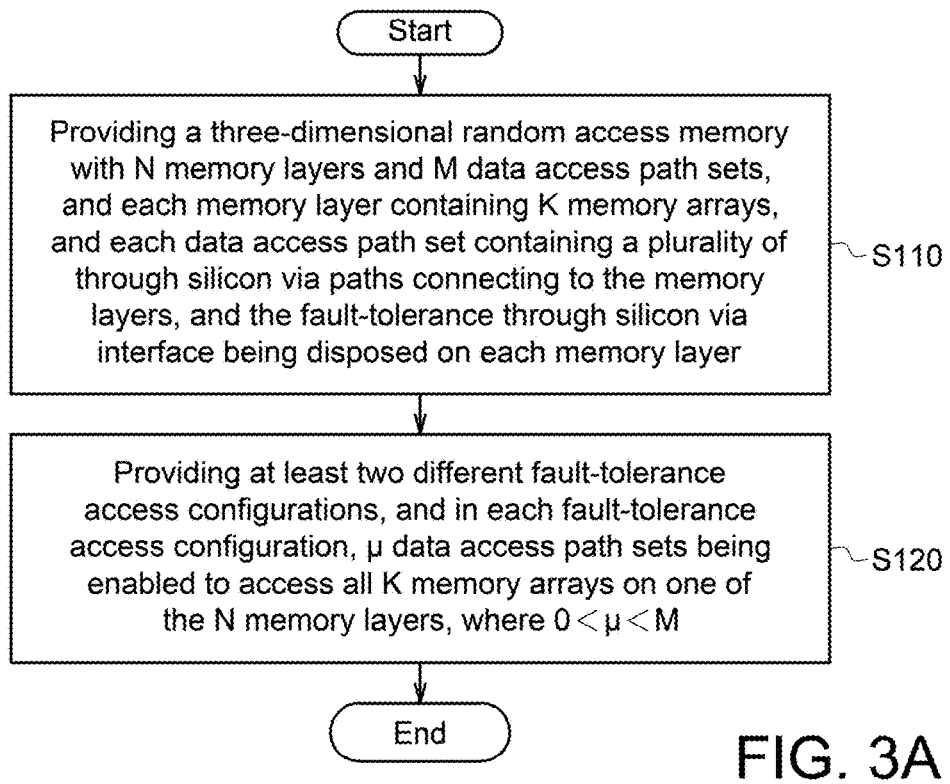
FIG. 3A and FIG. 3B are flow charts that illustrate exemplary embodiments of the fault-tolerance through silicon via interface controlling method.
Figure 3B:
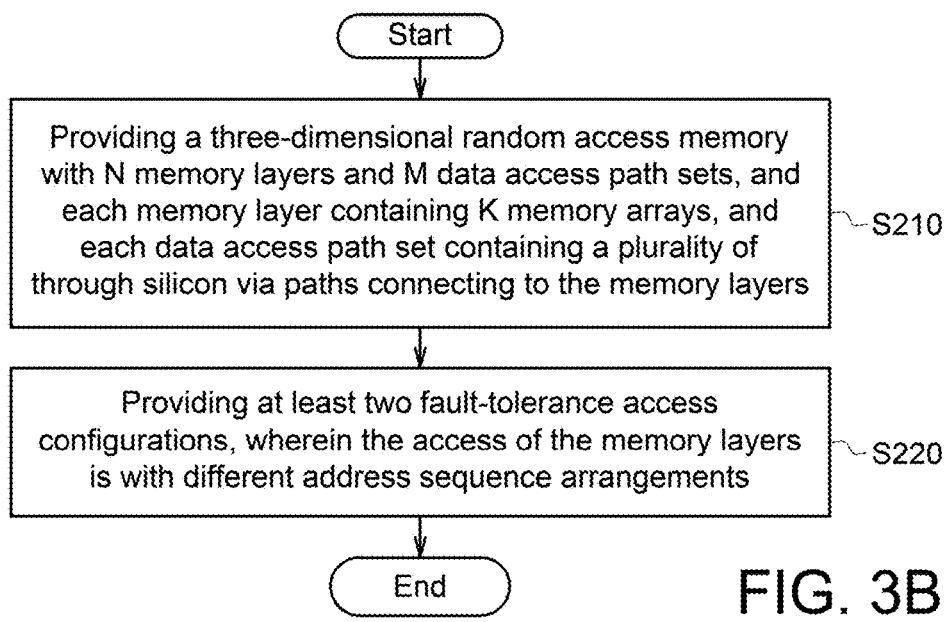
Figure 3C:
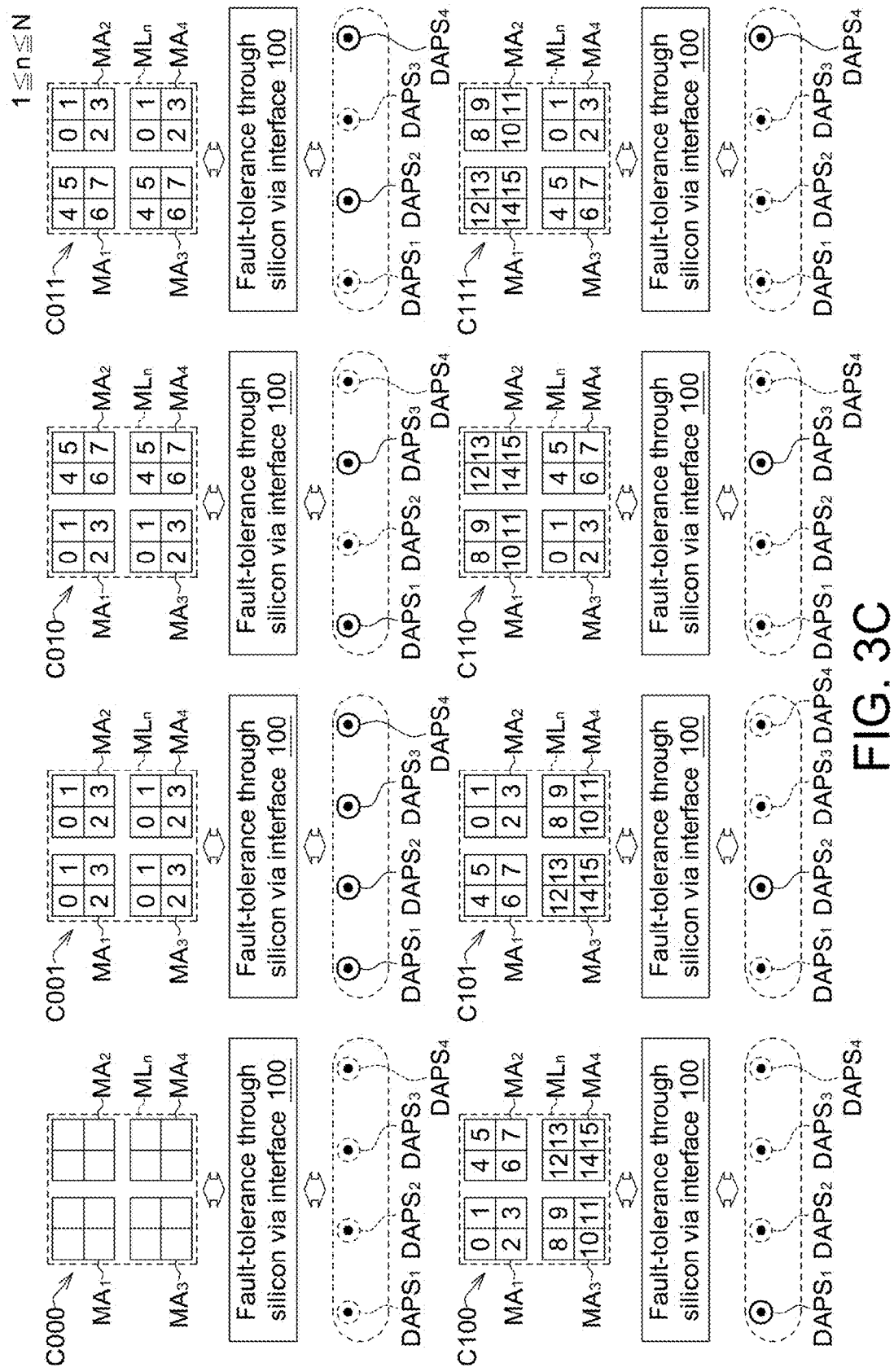
FIG. 3C illustrates an exemplary embodiment of the fault-tolerance through silicon via interface providing two normal access configurations and six fault-tolerance access configurations.

FIG. 3A and FIG. 3B are flow charts that illustrate two exemplary embodiments of the fault-tolerance TSV interface controlling methods. FIG. 3C assumes M=4 and K=4 of the 3-D RAM and illustrates an exemplary embodiment of a fault-tolerance TSV interface 100 providing two normal access configurations C000 and C001, and six fault-tolerance access configurations C010, C011, C100, C101, C110 and C111. The fault-tolerance TSV interface 100 in FIG. 2 could be operated with the controlling methods illustrated in FIG. 3A and FIG. 3B. A 3-D RAM as shown in FIG. 1 is provided in steps S110 and S210. At least two fault-tolerance access configurations, as shown in FIG. 3C, are provided in steps S120 and S220. In normal access configuration C000, all four data access path sets $DAPS_1$, $DAPS_2$, $DAPS_3$, and $DAPS_4$ are disabled and the dashed cycles indicate their disconnections. In normal access configuration C001, all four data access path sets $DAPS_1$, $DAPS_2$, $DAPS_3$, and $DAPS_4$ are enabled and the solid circles indicate their connections. The path controlling unit 110 and the memory controlling unit 130 is select data access path set $DAPS_1$ to access memory array $MA_1$, data access path set $DAPS_2$ to access memory array $MA_2$, data access path set $DAPS_3$ to access memory array $MA_3$, and data access path set $DAPS_4$ to access memory array $MA_4$, by the address sequence indexed by numbers 0, 1, 2, and 3. The same indices inside the memory arrays indicate the physical locations being accessed at the same time.

Figure 4:
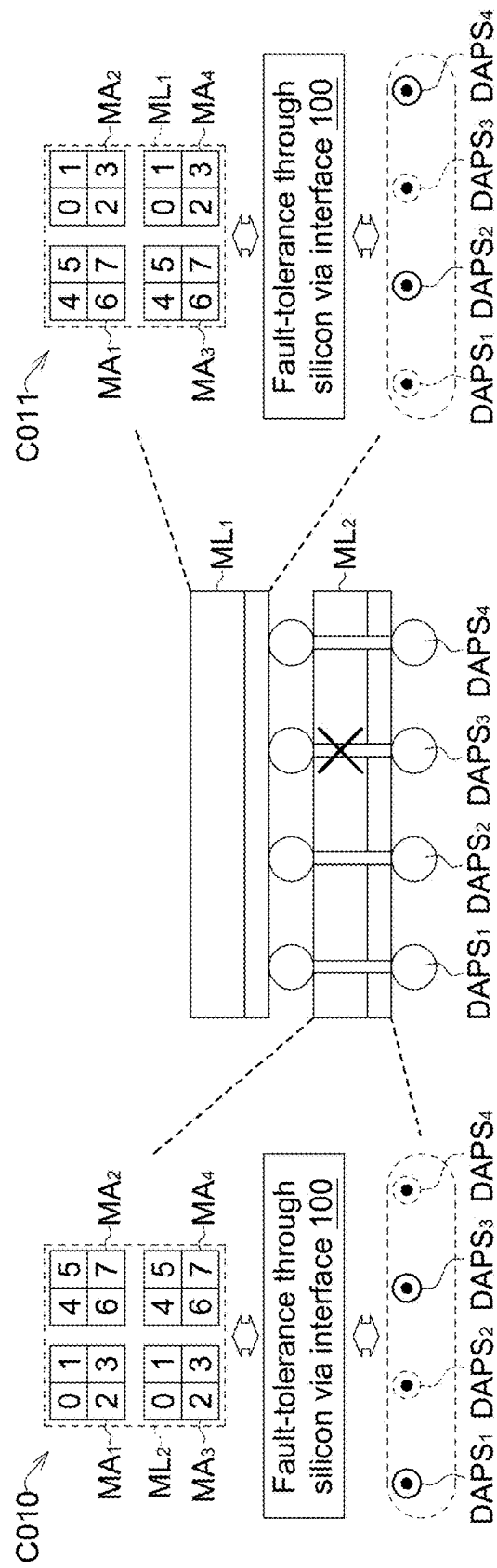
FIG. 4 illustrates an exemplary embodiment of a 3-D RAM adopting two fault-tolerance access configurations when a fault occurs in one of the data access path sets.

When the path controlling unit 110 detects any fault in the data access path sets $DAPS_1$, $DAPS_2$, $DAPS_3$, and $DAPS_4$, the processing unit 120 provides fault-tolerance access configurations C010, C011, C100, C101, C110 and C111 to support data access for the 3-D RAM. In FIG. 3C, we elaborate an exemplary embodiment of fault-tolerance TSV interface 100 providing six fault-tolerance access configurations C010, C011, C100, C101, C110, and C111. FIG. 4 assumes N=2, M=4, and K=4 of the 3-D RAM. We elaborate how the fault-tolerance access configurations C010 and C011 are adopted to access all memory arrays $MA_1$, $MA_2$, $MA_3$, and $MA_4$ in memory layers $ML_1$ and $ML_2$, and to maintain the access data width of the 3-D RAM in the presence of a fault in the data access path sets $DAPS_1$, $DAPS_2$, $DAPS_3$, and $DAPS_4$.

In fault-tolerance access configuration C010, the path controlling unit 110 enables two data access path sets $DAPS_1$ and $DAPS_3$ indicated by the solid circles and disables two data access path sets $DAPS_2$ and $DAPS_4$ indicated by the dashed circles. The path controlling unit 110 and the memory controlling unit 130 select $DAPS_1$ to access memory arrays $MA_1$ and $MA_2$, and $DAPS_3$ to access memory arrays $MA_3$ and $MA_4$, by the address sequence is indexed by numbers 0, 1, ..., 7. The same indices inside the memory arrays indicate the physical locations being accessed at the same time.

In fault-tolerance access configuration C011, the path controlling unit 110 enables two data access path sets $DAPS_2$ and $DAPS_4$ indicated by the solid circles and disables two data access path sets $DAPS_1$ and $DAPS_3$ indicated by the dashed circles. The path controlling unit 110 and the memory controlling unit 130 select $DAPS_2$ to access memory arrays $MA_2$ and $MA_1$, and $DAPS_4$ to access memory arrays $MA_4$ and $MA_3$, by the address sequence indexed by numbers 0, 1, ..., 7. The same indices inside the memory arrays indicate the physical locations being accessed at the same time.

In fault-tolerance access configuration C100, the path controlling unit 110 enables a data access path set $DAPS_1$ indicated by a solid circle and disables three data access path sets $DAPS_2$, $DAPS_3$, and $DAPS_4$ indicated by dashed circles. The path controlling unit 110 and the memory controlling unit 130 select $DAPS_1$ to access memory arrays $MA_1$, $MA_2$, $MA_3$, and $MA_4$, by the address sequence indexed by numbers 0, 1, . . . , 15.

In fault-tolerance access configuration C101, the path controlling unit 110 enables a data access path set $DAPS_2$ indicated by a solid circle and disables three data access path sets $DAPS_1$, $DAPS_3$, and $DAPS_4$ indicated by dashed circles. The path controlling unit 110 and the memory controlling unit 130 select $DAPS_2$ to access memory arrays $MA_2$, $MA_1$, $MA_4$, and $MA_3$, by the address sequence indexed by numbers 0, 1, . . . , 15.

In fault-tolerance access configuration C110, the path controlling unit 110 enables a data access path set $DAPS_3$ indicated by a solid circle and disables three data access path sets $DAPS_1$, $DAPS_2$, and $DAPS_4$ indicated by dashed circles. The path controlling unit 110 and the memory controlling unit 130 select $DAPS_3$ to access memory arrays $MA_3$, $MA_4$, $MA_1$, and $MA_2$, by the address sequence indexed by numbers 0, 1, . . . , 15.

In fault-tolerance access configuration C111, the path controlling unit 110 enables a data access path set $DAPS_4$ indicated by a solid circle and disables three data access path sets $DAPS_1$, $DAPS_2$, and $DAPS_3$ indicated by dashed circles. The path controlling unit 110 and the memory controlling unit 130 select $DAPS_4$ to access memory arrays $MA_4$, $MA_3$, $MA_2$, and $MA_1$, by the address sequence indexed by numbers 0, 1, . . . , 15.

In FIG. 2, the above eight access configurations, composed of two normal access configurations C000 and C001, and six fault-tolerance access configurations C010, C011, C100, C101, C110, and C111 can be selected by a 3-bit control signal.

In FIG. 4, a fault occurs in the data access path set $DAPS_3$ in the 3-D RAM. Fault-tolerance access configurations C011 and C010 are adopted in memory layers $ML_1$ and $ML_2$, respectively, as normal access configuration C001 fails to access $ML_1$ through $DAPS_3$.

As shown on the right of FIG. 4, memory layer $ML_1$ adopts the fault-tolerance access configuration C011 to enable data access path sets $DAPS_2$ and $DAPS_4$. The path controlling unit 110 and the memory controlling unit 130 select data access path set $DAPS_2$ to access memory arrays $MA_2$ and $MA_1$, and data access path set $DAPS_4$ to access memory arrays $MA_4$ and $MA_3$. Thus, all memory arrays $MA_1$, $MA_2$, $MA_3$, and $MA_4$ of memory layer $ML_1$ can be accessed.

As shown on the left of FIG. 4, memory layer $ML_2$ adopts the fault-tolerance access configuration C010 to enable data access path sets $DAPS_1$ and $DAPS_3$. The path controlling unit 110 and the memory controlling unit 130 select data access path set $DAPS_1$ to access memory arrays $MA_1$ and $MA_2$, and data access path set $DAPS_3$ to access memory arrays $MA_3$ and $MA_4$. Thus, all memory arrays $MA_1$, $MA_2$, $MA_3$, and $MA_4$ of memory layer $ML_2$ can be accessed.

Through the above setting, the fault occurring in the data access path set $DAPS_3$ is avoided. There is no need to equip any redundant TSV for memory layers $ML_1$ and $ML_2$, as $ML_1$ is accessed by $DAPS_2$ and $DAPS_4$, while $ML_2$ is accessed by $DAPS_1$ and $DAPS_3$. All data access path sets $DAPS_1$, $DAPS_2$, $DAPS_3$, and $DAPS_4$ are active concurrently, and thus, a full data width of the 3-D RAM can still be maintained. If the fault occurs in the other data access path set, a similar setting can be operated accordingly.

FIG. 4 shows four memory arrays and four data access path sets. In one embodiment, the number of memory arrays can be K and the number of data access path sets can be M, where both K and M are natural numbers and are greater than one. In a fault-tolerance access configuration, μ data access path sets are enabled to access memory arrays, where μ is a natural number and 0<μ<M. The path controlling unit 110 and the memory controlling unit 130 select each data access path set to access K/μ memory arrays in each memory layer. The address sequence of the memory arrays or the physical locations in the memory arrays may be different from that in the embodiment of FIG. 3C.

Figure 5:
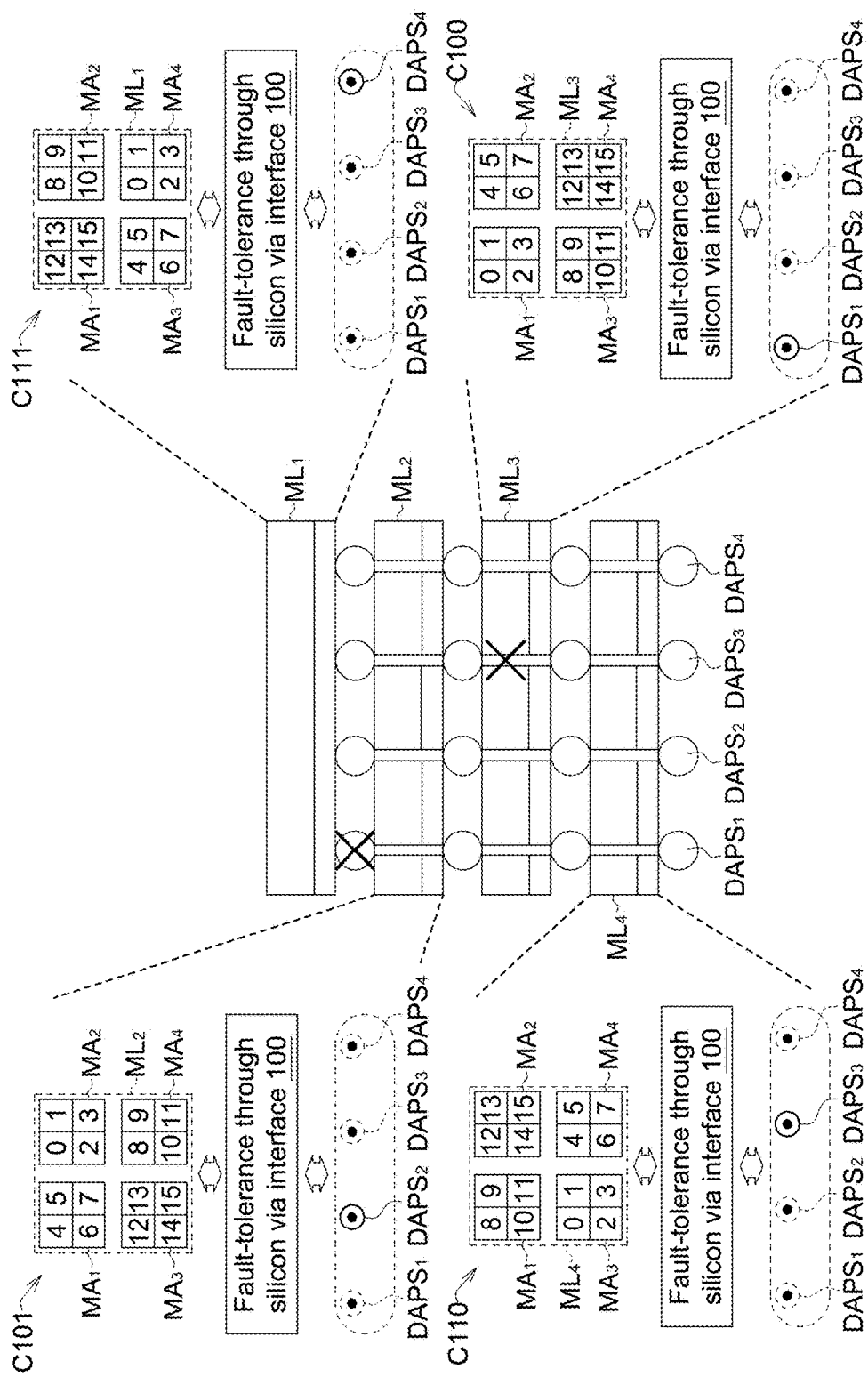
FIG. 5 illustrates an exemplary embodiment of a 3-D RAM adopting four fault-tolerance access configurations when two faults occur in two of the data access path sets.

In FIG. 5, two faults occur in data access path sets $DAPS_1$ and $DAPS_3$ in the 3-D RAM. Fault-tolerance access configurations C111, C101, C100, and C110 are adopted in memory layers $ML_1$, $ML_2$, $ML_3$, and $ML_4$, respectively, as normal access configuration C001 fails to access $ML_1$ through $DAPS_1$ and to access $ML_1$ and $ML_2$ through $DAPS_3$.

As shown on the upper right of FIG. 5, memory layer $ML_1$ adopts fault-tolerance access configuration C111 to enable data access path set $DAPS_4$. The path controlling unit 110 and the memory controlling unit 130 select $DAPS_4$ to access memory arrays on memory layer $ML_1$, according to the address sequence $MA_4$, $MA_3$, $MA_2$, and $MA_1$.

As shown on the upper left of FIG. 5, memory layer $ML_2$ adopts fault-tolerance access configuration C101 to enable data access path set $DAPS_2$. The path controlling unit 110 and the memory controlling unit 130 select $DAPS_2$ to access memory arrays on memory layer $ML_2$, according to is the address sequence $MA_2$, $MA_1$, $MA_4$, and $MA_3$.

As shown on the lower right of FIG. 5, memory layer $ML_3$ adopts fault-tolerance access configuration C100 to enable data access path set $DAPS_1$. The path controlling unit 110 and the memory controlling unit 130 select $DAPS_1$ to access memory arrays on memory layer $ML_3$, according to the address sequence $MA_1$, $MA_2$, $MA_3$, and $MA_4$.

As shown on the lower left of FIG. 5, memory layer $ML_4$ adopts fault-tolerance access configuration C110 to enable data access path set $DAPS_3$. The path controlling unit 110 and the memory controlling unit 130 select $DAPS_3$ to access memory arrays on memory layer $ML_4$, according to the address sequence $MA_3$, $MA_4$, $MA_1$, and $MA_2$.

Through the above setting, the two faults occurring in data access path sets $DAPS_1$ and $DAPS_3$ are avoided. There is no need to equip any redundant TSV for memory layers $ML_1$, $ML_2$, $ML_3$, and $ML_4$. The four memory layers $ML_1$, $ML_2$, $ML_3$, and $ML_4$ are accessed at the same time, respectively, by data access path sets $DAPS_4$, $DAPS_2$, $DAPS_1$, and $DAPS_3$. Thus, a full data width of the 3-D RAM can still be maintained. If two faults occur in other pairs of data access path sets, such as $DAPS_1$ and $DAPS_2$, a similar setting can be operated accordingly.

FIG. 5 shows four memory arrays and four data access path sets. In one embodiment, the number of memory arrays can be K and the number of data access path sets can be M, where both K and M are natural numbers and are greater than one. In a fault-tolerance access configuration, μ data access path sets are enabled to access memory arrays, where μ is a natural number and 0<μ<M. The path controlling unit 110 and the memory controlling unit 130 select each data access path set to access K/μ memory arrays in each memory layer. The address sequence of the memory arrays or the physical locations in the memory arrays may be different from that in the embodiment of FIG. 3C.

Figure 6:
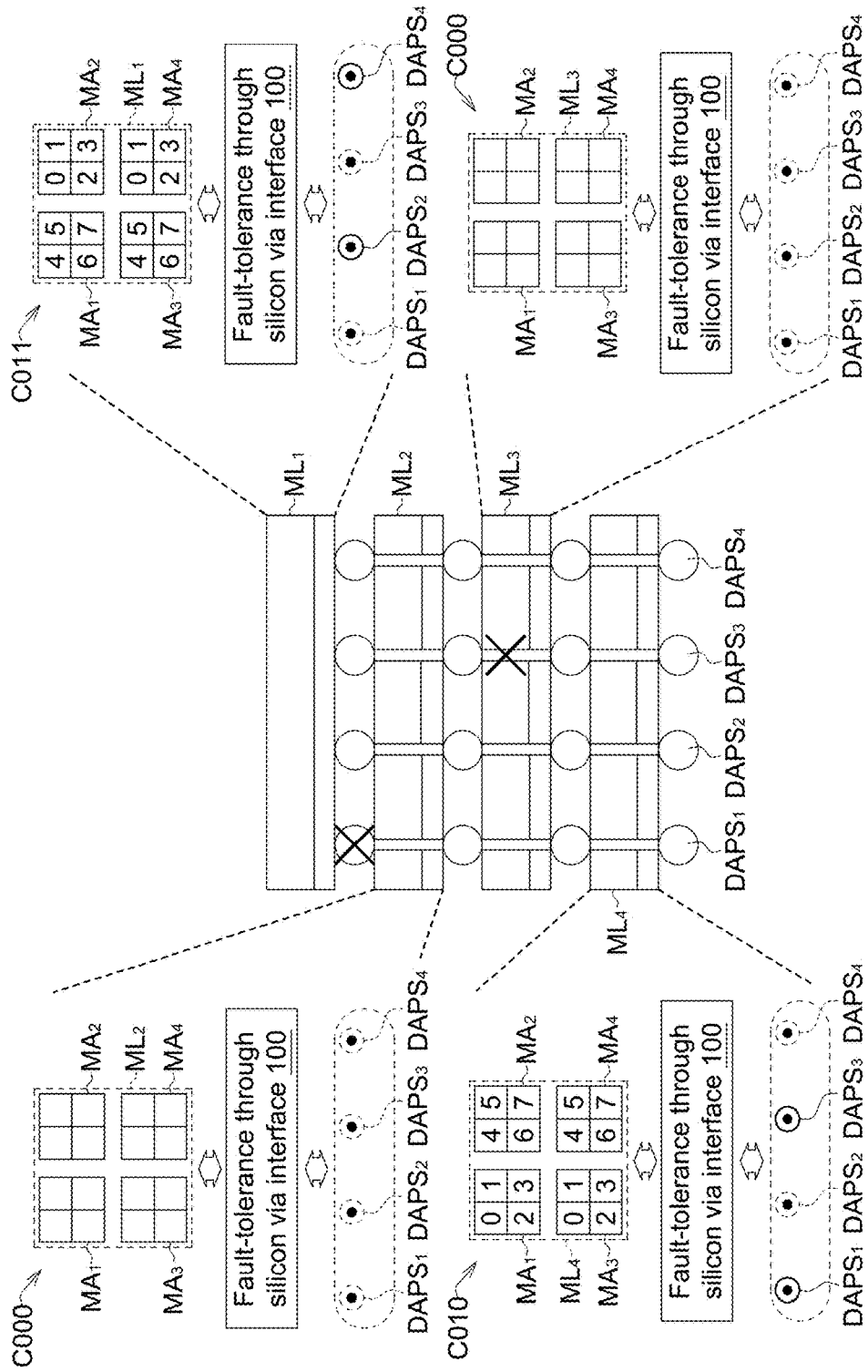
FIG. 6 illustrates an exemplary embodiment of a 3-D RAM adopting two fault-tolerance access configurations when two faults occur in two of the data access path sets.

In FIG. 6, two faults occur in data access path sets DAPS$_1$ and DAPS$_3$ in the 3-D RAM. Fault-tolerance access configurations C011 and C010 are adopted in memory layers ML$_1$ and ML$_4$, respectively, as normal access configuration C001 fails to access ML$_1$ through DAPS$_1$ and DAPS$_3$.

As shown on the upper right of FIG. 6, memory layer ML$_1$ adopts fault-tolerance access configuration C011 to enable data access path sets DAPS$_2$ and DAPS$_4$. The path controlling unit 110 and the memory controlling unit 130 select DAPS$_2$ to access memory arrays MA$_2$ and MA$_4$, and DAPS$_4$ to access memory arrays MA$_4$ and MA$_3$, all on memory layer ML$_1$, according to the prescribed address sequence.

As shown on the lower left of FIG. 6, memory layer ML$_4$ adopts fault-tolerance access configuration C010 to enable data access path sets DAPS$_1$ and DAPS$_3$. The path controlling unit 110 and the memory controlling unit 130 select DAPS$_1$ to access memory arrays MA$_4$ and MA$_2$, and DAPS$_3$ to access memory arrays MA$_3$ and MA$_4$, all on memory layer ML$_4$, according to the prescribed address sequence.

Through the above setting, the two faults occurring in data access path sets DAPS$_1$ and DAPS$_3$ are avoided. There is no need to equip any redundant TSV for memory layers ML$_1$ and ML$_4$. The two memory layers ML$_1$ and ML$_4$ are accessed at the same time, respectively, by data access path sets DAPS$_2$, DAPS$_4$ and DAPS$_1$, DAPS$_3$. Thus, a full data width of the 3-D RAM can still be maintained.

Figure 7:
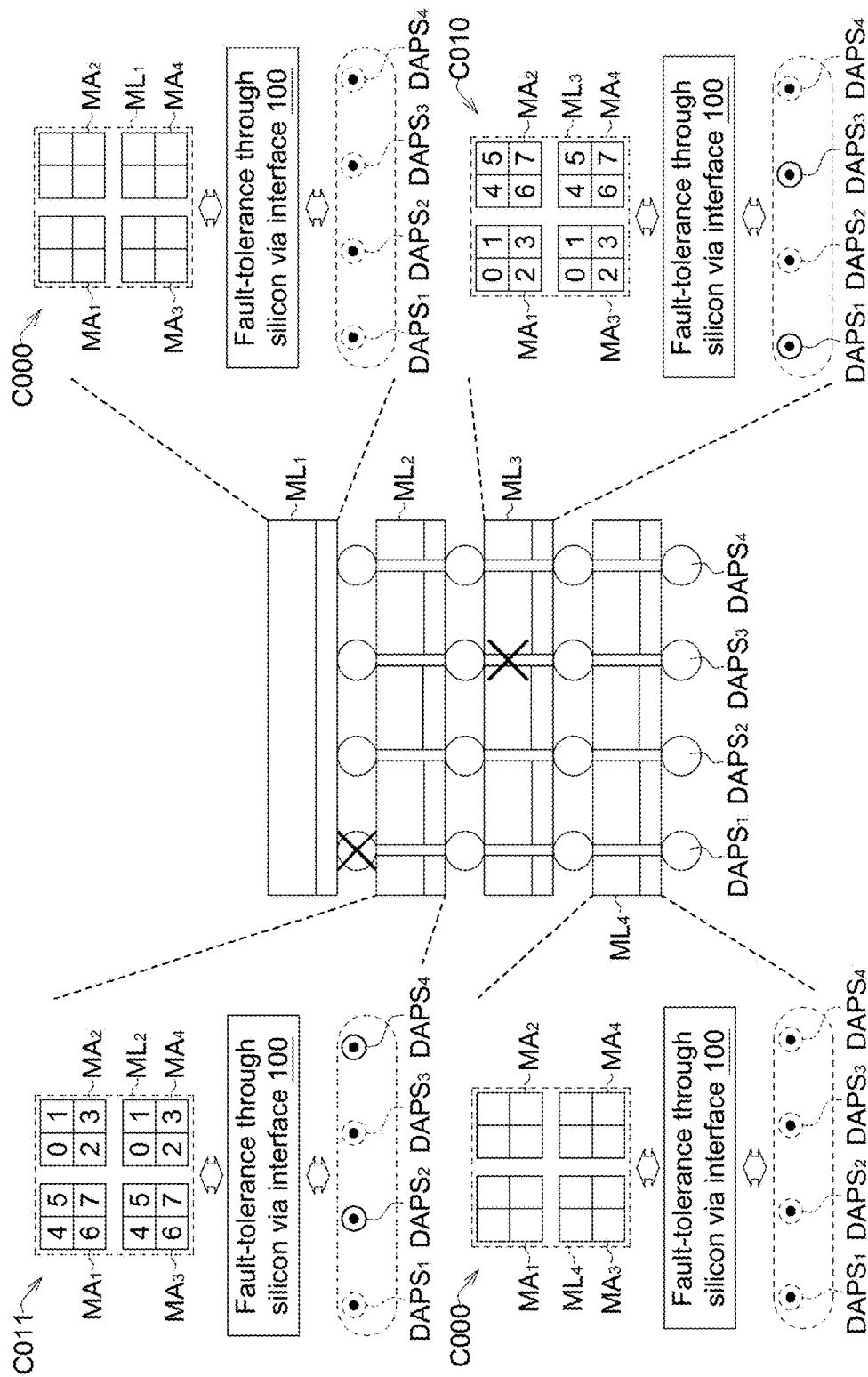
FIG. 7 illustrates an exemplary embodiment of a 3-D RAM adopting two fault-tolerance access configurations in the other two memory layers when two faults occur in two of the data access path sets.

In FIG. 7, two faults occur in data access path sets DAPS$_1$ and DAPS$_3$ in the 3-D RAM. Fault-tolerance access configurations C011 and C010 are adopted in memory layers ML$_2$ and ML$_3$, respectively, as normal access configuration C001 fails to access ML$_2$ through DAPS$_3$.

As shown on the upper left of FIG. 7, memory layer ML$_2$ adopts fault-tolerance access configuration C011 to enable data access path sets DAPS$_2$ and DAPS$_4$. The path controlling unit 110 and the memory controlling unit 130 select DAPS$_2$ to access memory arrays MA$_2$ and MA$_1$, and DAPS$_4$ to access memory arrays MA$_4$ and MA$_3$, all on memory layer ML$_2$, according to the prescribed address sequence.

As shown on the lower right of FIG. 7, memory layer ML$_3$ adopts fault-tolerance access configuration C010 to enable data access path sets DAPS$_1$ and DAPS$_3$. The path controlling unit 110 and the memory controlling unit 130 select DAPS$_1$ to access memory arrays MA$_1$ and MA$_2$, and DAPS$_3$ to access memory arrays MA$_3$ and MA$_4$, all on memory layer ML$_3$, according to the prescribed address sequence.

Through the above setting, the two faults occurring in data access path sets DAPS$_1$ and DAPS$_3$ are avoided. There is no need to equip any redundant TSV for memory layers ML$_2$ and ML$_3$. The two memory layers ML$_2$ and ML$_3$ are accessed at the same time, respectively, by data access path sets DAPS$_2$, DAPS$_4$ and DAPS$_1$, DAPS$_3$. Thus, a full data width of the 3-D RAM can still be maintained.

In another embodiment, the settings of FIG. 6 and FIG. 7 can be interleaved in time. In one time, the setting of FIG. 6 is used to access memory layers ML$_1$ and ML$_4$; in another time, the setting of FIG. 7 is used to access memory layers ML$_2$ and ML$_3$. Thus, all memory layers ML$_1$, ML$_2$, ML$_3$, and ML$_4$ of the 3-D RAM are accessed.

The above embodiments show concurrent accesses of two memory layers (ML$_1$ and ML$_4$ or ML$_2$ and ML$_3$) or four memory layers (ML$_1$, ML$_2$, ML$_3$, ML$_4$) in the 3-D RAM. In one embodiment, $2^b$ memory layers are concurrently accessed by data access path sets, where b is a natural number.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

Moreover, the claims should not be read as limited to the described order or elements unless stated to that effect. In addition, use of the term "means" in any claim is intended to invoke 35 U.S.C. §112, ¶6, and any claim without the word "means" is not so intended.

What is claimed is:

1. A fault-tolerance through silicon via interface, wherein the fault-tolerance through silicon via interface is disposed in a three-dimensional random access memory with N memory layers and M data access path sets, each of the memory layers contains K memory arrays, each of the data access path sets contains a plurality of through silicon via paths connecting to the N memory layers, and the fault-tolerance through silicon via interface comprises:
   a path controlling unit, detecting and controlling the M data access path sets; and
   a processing unit, wherein when a fault occurs in any of the data access path sets connecting to one of the N memory layers, two or more different fault-tolerance access configurations are provided; in each of the fault-tolerance access configurations, μ, data access path sets are enabled to access all K memory arrays on one of the N memory layers, where $0 < \mu < M$; in the two or more different fault-tolerance access configurations, all of the K memory arrays in each of the N memory layers are accessed even if one of the through silicon via paths is failed.

2. The fault-tolerance through silicon via interface of claim 1, further comprising:
   a memory controlling unit, wherein in one of the fault-tolerance access configurations, the path controlling unit and the memory controlling unit select each of the μ data access path sets to access K/μ out of K memory arrays on the corresponding memory layer.

3. The fault-tolerance through silicon via interface of claim 1, further comprising:
   a memory controlling unit, wherein in one of the fault-tolerance access configurations, the path controlling unit and the memory controlling unit select each of the μ data access path sets to access two out of K memory arrays on the corresponding memory layer.

4. The fault-tolerance through silicon via interface of claim 1, further comprising:
   a memory controlling unit, wherein in one of the fault-tolerance access configurations, the path controlling unit and the memory controlling unit select each of the μ data access path sets to access all K memory arrays on the corresponding memory layer.

5. The fault-tolerance through silicon via interface of claim 1, wherein in one of the fault-tolerance access configurations, the path controlling unit enables two out of M data access path sets connecting to the corresponding memory layer.

6. The fault-tolerance through silicon via interface of claim 1, wherein in one of the fault-tolerance access configurations, the path controlling unit enables one out of M data access path set connecting to the corresponding memory layer.

7. The fault-tolerance through silicon via interface of claim 1, further comprising:
   a memory controlling unit, selecting the data access path sets to concurrently access $2^b$ out of N memory layers, where b is a natural number.

8. A controlling method of a fault-tolerance through silicon via interface, wherein the controlling method comprises:

providing a three-dimensional random access memory with N memory layers and M data access path sets, wherein each of the memory layers contains K memory arrays, each of the data access path sets contains a plurality of through silicon via paths connecting to the N memory layers, and the fault-tolerance through silicon via interface is disposed on each of the N memory layers; and providing two or more different fault-tolerance access configurations, when a fault occurs in any of the data access path sets connecting to one of the N memory layers; wherein in each of the fault-tolerance access configurations, $\mu$ data access path sets are enabled to access all K memory arrays on one of the N memory layers, where $0<\mu<M$; in the two or more different fault-tolerance access configurations, all of the K memory arrays in each of the N memory layers are accessed even if one of the through silicon via paths is failed.

9. The controlling method of claim 8, wherein one of the fault-tolerance access configurations has each of the $\mu$ data access path sets accessing K/$\mu$ memory arrays on the corresponding memory layer.

10. The controlling method of claim 8, wherein one of the fault-tolerance access configurations has each of the $\mu$ data access path sets accessing two of the memory arrays on the corresponding memory layer.

11. The controlling method of claim 8, wherein one or more of the fault-tolerance access configurations has each of the $\mu$ data access path sets accessing all K memory arrays on the corresponding memory layer.

12. The controlling method of claim 8, wherein one or more of the fault-tolerance access configurations has two of the data access path sets connecting to the corresponding memory layer enabled.

13. The controlling method of claim 8, wherein one or more of the fault-tolerance access configurations has one of the data access path sets connecting to the corresponding memory layer enabled.

14. The controlling method of claim 8, wherein the data access path sets concurrently access $2^b$ out of N memory layers, where b is a natural number.

15. The controlling method of claim 8, further comprising:

selecting six fault-tolerance access configurations using a 3-bit control signal.

16. A fault-tolerance through silicon via interface controlling method, comprising:

providing a three-dimensional random access memory with N memory layers and M data access path sets, wherein each of the memory layers contains K memory arrays, each of the data access path sets contains a plurality of through silicon via paths connecting to the N memory layers, and the fault-tolerance through silicon via interface is disposed on each of the N memory layers; and providing two or more fault-tolerance access configurations, when a fault occurs in any of the data access path sets connecting to one of the N memory layers; wherein the access of the K memory layers is with different address sequence arrangements; in the two or more different fault-tolerance access configurations, all of the K memory arrays in each of the N memory layers are accessed even if one of the through silicon via paths is failed.

* * * * *